United States Patent
Washio

(10) Patent No.: US 12,345,950 B2
(45) Date of Patent: Jul. 1, 2025

(54) OPTICAL ELEMENT DRIVING DEVICE, CAMERA DEVICE AND ELECTRONIC APPARATUS

(71) Applicant: New Shicoh Motor Co., LTD, Yamato (JP)

(72) Inventor: Noriyuki Washio, Yamato (JP)

(73) Assignee: NEW SHICOH MOTOR CO., LTD, Yamato (JP)

( * ) Notice: Subject to any disclaimer, the term of this patent is extended or adjusted under 35 U.S.C. 154(b) by 737 days.

(21) Appl. No.: 17/577,806

(22) Filed: Jan. 18, 2022

(65) Prior Publication Data

US 2022/0137327 A1    May 5, 2022

Related U.S. Application Data

(63) Continuation-in-part of application No. 16/716,951, filed on Dec. 17, 2019, now Pat. No. 11,256,061.

(30) Foreign Application Priority Data

May 22, 2019 (JP) .................. 2019-096233
May 22, 2019 (JP) .................. 2019-096241
(Continued)

(51) Int. Cl.
*G02B 7/18*    (2021.01)
*G03B 5/02*    (2021.01)
(Continued)

(52) U.S. Cl.
CPC ............ *G02B 7/1805* (2013.01); *G03B 5/02* (2013.01); *G03B 13/34* (2013.01); *H01F 7/081* (2013.01);
(Continued)

(58) Field of Classification Search
CPC ... G02B 7/00; G02B 7/02; G02B 7/04; G02B 7/105; G02B 7/102; G02B 7/18;
(Continued)

(56) References Cited

U.S. PATENT DOCUMENTS

2012/0019642 A1   1/2012   Hillis et al.
2018/0259787 A1*  9/2018   Kim ................. H04N 23/687

FOREIGN PATENT DOCUMENTS

CN   205942054 U   2/2017
JP   S57177039 A   10/1982
(Continued)

OTHER PUBLICATIONS

Office Action issued by JPO for Patent Application No. 2019-096233, Jul. 12, 2019.
(Continued)

*Primary Examiner* — Jie Lei
(74) *Attorney, Agent, or Firm* — Hayes Soloway P.C.

(57) ABSTRACT

A camera device is described that includes a prism driving device for driving a prism, a lens driving device for driving a lens body, and a base for fixing an image sensor. These components stand in order in a straight line in a case. The prism driving device has a driving portion and a flexible printed circuit board for relaying current supply from an external portion to the driving portion. Terminals of the flexible printed circuit board are connected to terminal receiving portions of the base.

13 Claims, 10 Drawing Sheets

(30) Foreign Application Priority Data

May 22, 2019 (JP) ................................. 2019-096254
May 22, 2019 (JP) ................................. 2019-096260

(51) Int. Cl.
  *G03B 13/34* (2021.01)
  *H01F 7/08* (2006.01)
  *H05K 1/18* (2006.01)
(52) U.S. Cl.
  CPC .................. *G03B 2205/003* (2013.01); *G03B 2205/0069* (2013.01); *H05K 1/189* (2013.01); *H05K 2201/052* (2013.01); *H05K 2201/1003* (2013.01)
(58) Field of Classification Search
  CPC .. G02B 7/1805; G02B 13/00; G02B 13/0065; G02B 26/08; G02B 26/0883; G03B 5/04; G03B 5/00; G03B 5/02; G03B 30/00; G03B 3/10; G03B 13/36; G03B 13/34; G03B 17/17; G03B 2205/003; G03B 2205/0069; G03B 2205/0015; H05K 1/89; H05K 1/189; H05K 2201/052; H05K 2201/1003; H01F 7/08; H01F 7/081
  USPC ....... 359/813, 819, 823, 833, 850, 557, 554; 396/55, 52, 75, 77
  See application file for complete search history.

(56) References Cited

FOREIGN PATENT DOCUMENTS

| | | |
|---|---|---|
| JP | H6294 U | 1/1994 |
| JP | H0793783 A | 4/1995 |
| JP | H084761 A | 1/1996 |
| JP | 2002258200 A | 9/2002 |
| JP | 2002267987 A | 9/2002 |
| JP | 2007310084 A | 11/2007 |
| JP | 2014085624 A | 5/2014 |
| WO | 2007091112 A1 | 8/2007 |

OTHER PUBLICATIONS

Office Action issued by JPO for Patent Application No. 2019-096241, Jul. 30, 2019.
Office Action issued by JPO for Patent Application No. 2019-096260, Nov. 28, 2019.
Office Action issued by JPO for Patent Application No. 2019-096254, Nov. 28, 2019.
Office Action issued by JPO for Patent Application No. 2019-096254, Jul. 30, 2019.
Office Action issued by JPO for Patent Application No. 2019-096260, Jul. 30, 2019.

* cited by examiner

OPTICAL ELEMENT DRIVING DEVICE, CAMERA DEVICE AND ELECTRONIC APPARATUS

CROSS-REFERENCE TO RELATED APPLICATIONS

This application is a continuation-in-part of U.S. patent application Ser. No. 16/716,951, filed Dec. 17, 2019, and titled OPTICAL ELEMENT DRIVING DEVICE, CAMERA DEVICE, AND ELECTRONIC APPARATUS, which claims the benefit of Japanese patent applications JP2019-096233, JP2019-096241, JP2019-096254 and JP2019-096260, each filed on May 22, 2019, the entire contents of each of which are incorporated by reference herein.

TECHNICAL FIELD

The present disclosure relates to an optical element driving device, a camera device and an electronic apparatus used in electronic apparatus such as smartphones.

BACKGROUND

A camera device mounted in an electronic apparatus such as a smartphone has a prism for correcting image blur and a member holding the prism in a rockable manner, and has a configuration in which light from a subject is guided to an imaging surface of the camera after being reflected by the prism. As an example of such a document disclosing a technique related to this type of camera device, Chinese utility model CN205942054U (hereinafter referred to as "Patent Document 1") may be picked up. A periscopic imaging module described in Patent Document 1 has a prism, a prism pedestal having a tapered surface on which the prism is placed, a supporting shaft inserted into the shaft hole of the prism pedestal, a magnet and a coil generating a driving force of the prism pedestal, and a housing supporting two ends of the supporting shaft in a rockable manner. In this periscopic imaging module, the prism pedestal and the prism on the supporting surface of the prism pedestal are rocked with the supporting shaft as a rocking shaft by the driving force of the magnet and the coil.

However, in the technique of Patent Document 1, since the rocking shaft of the prism does not coincide with the reflecting surface of the prism, there is a problem that it is difficult to reduce the size of the device because a large space is required to rock the prism only at the same angle.

The present disclosure has been made in view of such problem, and an object thereof is to provide an optical element driving device, a camera device and an electronic apparatus requiring a small space for rocking and easy to be miniaturized.

SUMMARY

According to a first aspect of the present disclosure, there is provided a camera device includes: a prism driving device for driving a prism, a lens driving device for driving a lens body, and a base for fixing an image sensor, standing in order in a straight line in a case, wherein the prism driving device has a driving portion, a flexible printed circuit board for relaying current supply from an external portion to the driving portion and a terminals of the flexible printed circuit board are connected to terminal receiving portions of the base.

According to a second aspect of the present disclosure, there is provided an electronic apparatus including the camera device described above.

DETAILED DESCRIPTION

Figure 1:
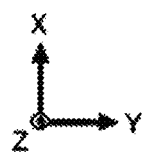
FIG. 1 is a front view of a smartphone which is an electronic apparatus mounted with a camera device, including a prism driving device according to one embodiment of the present disclosure.
Figure 1:
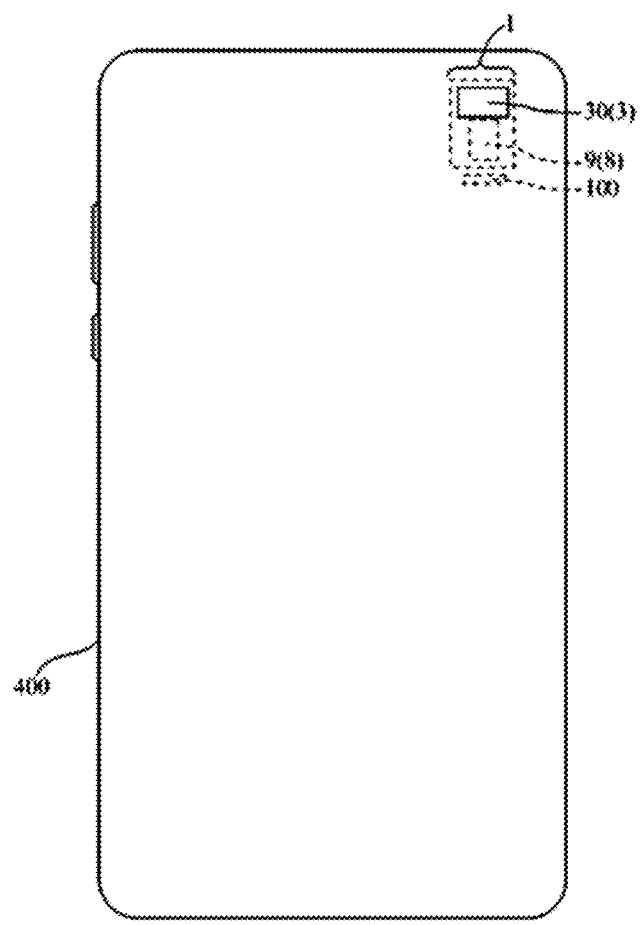

Hereinafter, embodiments of the present disclosure are explained with reference to drawings. As shown in FIG. 1, the camera device 1 is embedded in the corner on the rear surface of the housing of the smartphone 400. The camera device 1 has a prism 30 and lens body 9 as an optical element, a prism driving device 3, a lens driving device 8, and an image sensor 100 that photoelectrically converts light guided from a subject via the prism 30 and the lens body 9.

Hereinafter, an optical axis direction along the optical axis of the lens body 9 is appropriately referred to as an X direction. Further, a direction which is perpendicular to the X direction and along which light from the subject is incident on the prism 30 is appropriately referred to as a Z direction, and a direction perpendicular to both the X direction and the Z direction is appropriately referred to as Y direction. Further, the side where the prism 30 is located in the X direction when viewed from the lens body 9 is referred to as an upper side, and the opposite side thereof which is the image sensor 100 side is referred to as a lower side. Further, the subject side in the Z direction when viewed from the prism 30 is referred to as a front side and the opposite side thereof is referred to as a rear side. Further, one side of the Y directions may be referred to as the left side and the other as the right side. The Z direction correspond to the thickness direction of the camera device 1, the prism driving device 3, and the lens driving device 8, and to the thickness direction of the fixed portion described later.

Figure 2:
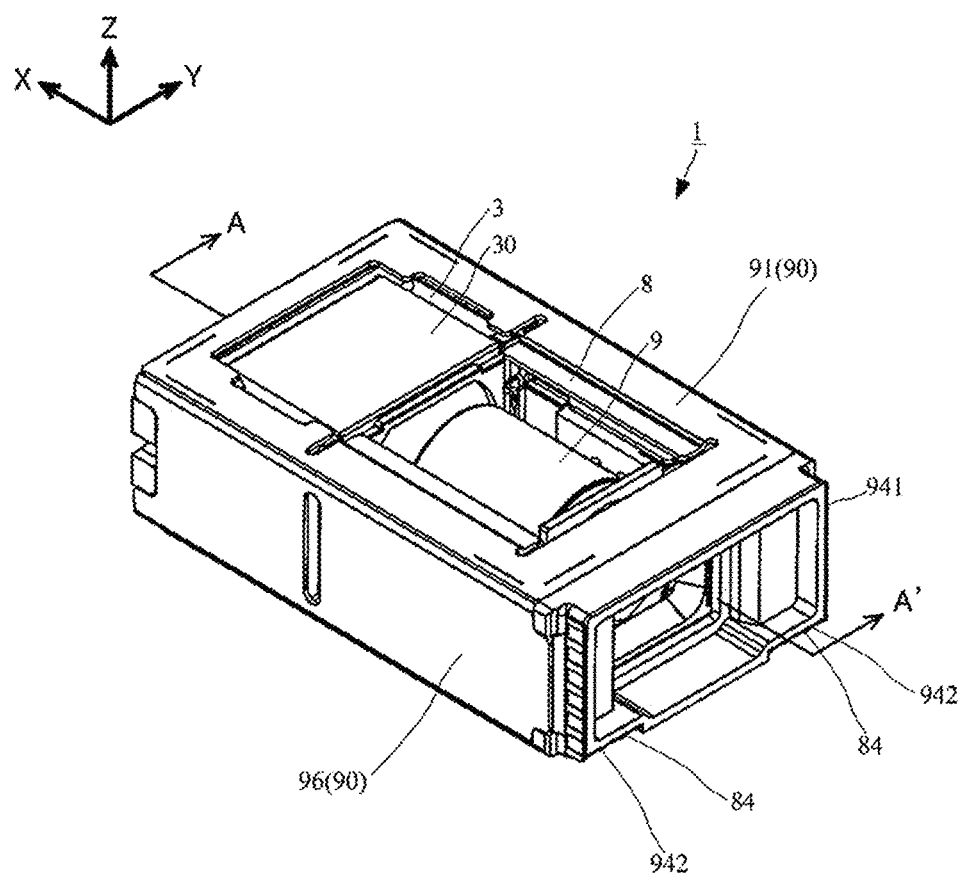
FIG. 2 is a perspective view of the camera device including the prism driving device of FIG. 1.
Figure 4:
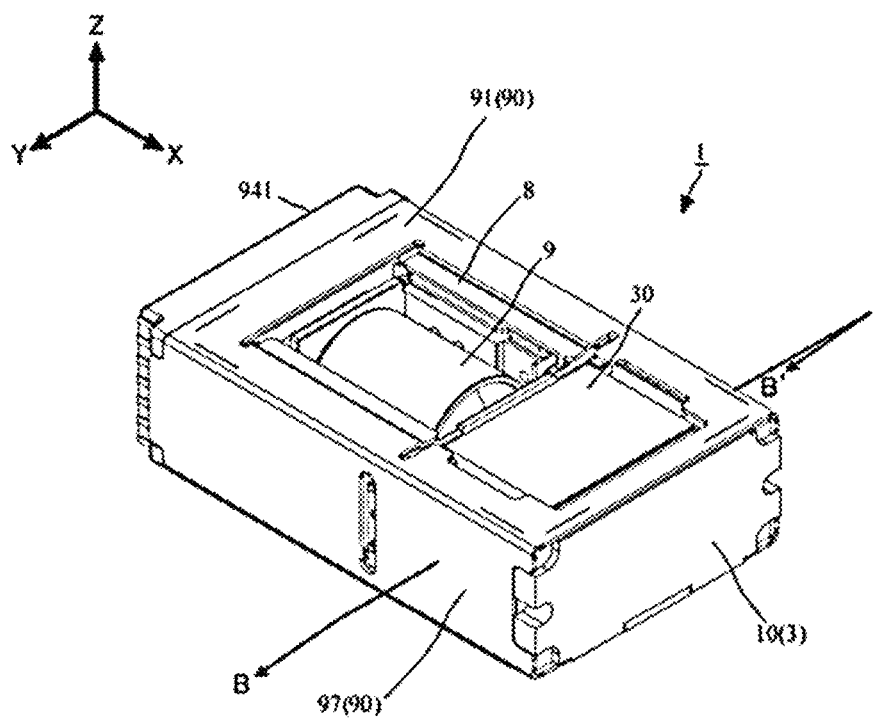
FIG. 4 is a perspective view of the camera device including the prism driving device of FIG. 2 as viewed from another viewpoint.

As shown in FIG. 2 and FIG. 4, the case 90 of the camera device 1 has a hollow rectangular parallelepiped shape. The lens body 9 and the lens driving device 8 holding the lens body 9, the prism 30 and the prism driving device 3 holding the prism 30 are aligned in the X direction and accommodated in a space inside the case 90. The prism driving device 3 is an optical element driving device. The optical element may be a reflecting mirror or the like as well as the prism 30.

Figure 6:
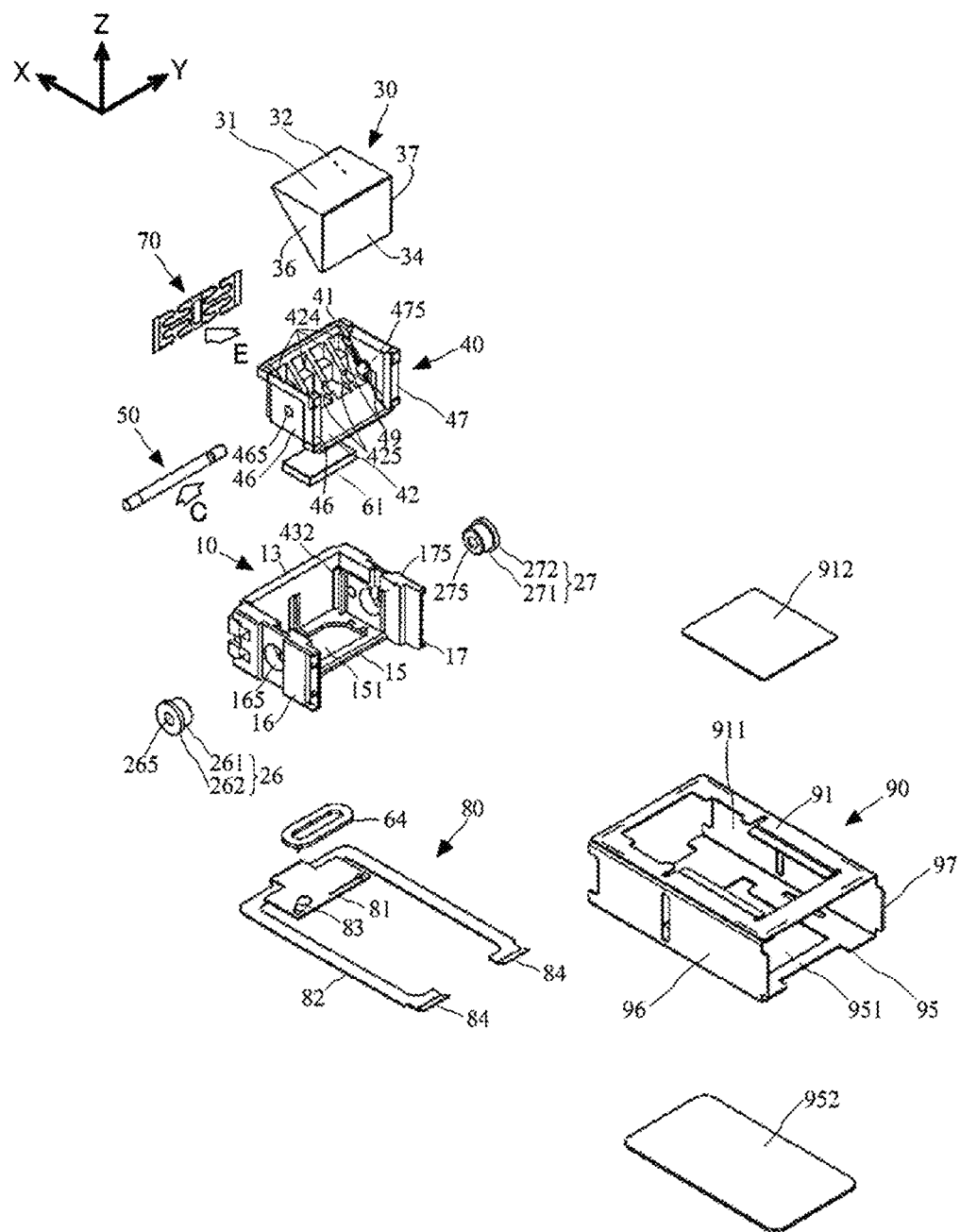
FIG. 6 is an exploded perspective view of the prism driving device of FIG. 2.

As shown in FIG. 6, a plate 91 on the front side of the case 90 has an opening 911, and a plate 95 on the rear side has an opening 951. The lens body 9 can pass the opening 911, the opening 911 allows the lens body to be arranged in the case, and the incidence surface 31 of the prism 30 can be exposed from the opening 911. A plate 912 is attached to the opening 911 on the front side, and a plate 952 is attached to the opening 951 on the rear side. The lens body 9 is covered from the front side and the rear side. In a state where the plate 912 is attached to the opening 911, the prism 30 is exposed to the front side from a portion on the upper side of the opening 911. A base 941 is fitted into an opening on the lower side of the case 90. The image sensor 100 is fixed to the base 941 with its light receiving surface facing the lens body 9. Further, a housing 10 of a prism driving device 3 to be described later is fitted and exposed in the opening on the upper side of the case 90.

Figure 3:
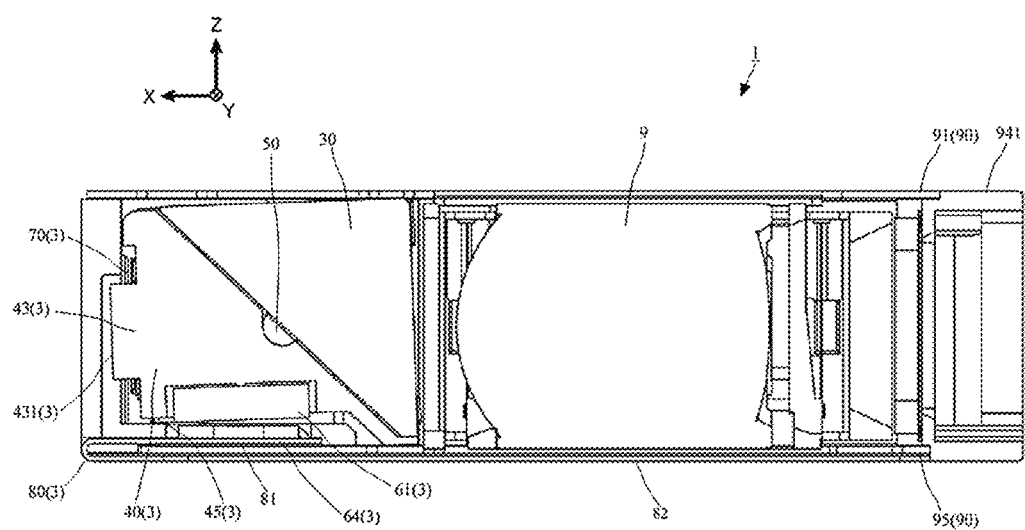
FIG. 3 is a cross-sectional view taken along line A-A' of FIG. 2.

The lens driving device 8 holds the lens body 9 and drives the lens body 9 in the X direction and the Y direction by an electrical signal given from a substrate of the smartphone 400. As shown in FIG. 3, the lens driving device 8 has an X direction supporting spring (not shown), an X direction driving magnet and an X direction driving coil (not shown), a Y direction supporting spring (not shown), a Y direction driving magnet and a Y direction driving coil (not shown). When an electric current is supplied to the X direction driving coil or the Y direction driving coil of the lens driving device 8, an electromagnetic force is generated in the X direction driving coil or a Y direction driving coil and resists the urging force of the X direction spring or the Y direction spring, so that the lens body 9 moves in the X direction or the Y direction. Focus adjustment can be performed by the moving of the lens body 9 in the X direction, and shaking correction in the Y direction can be performed by the moving of the lens body 9 in the Y direction.

Figure 7:
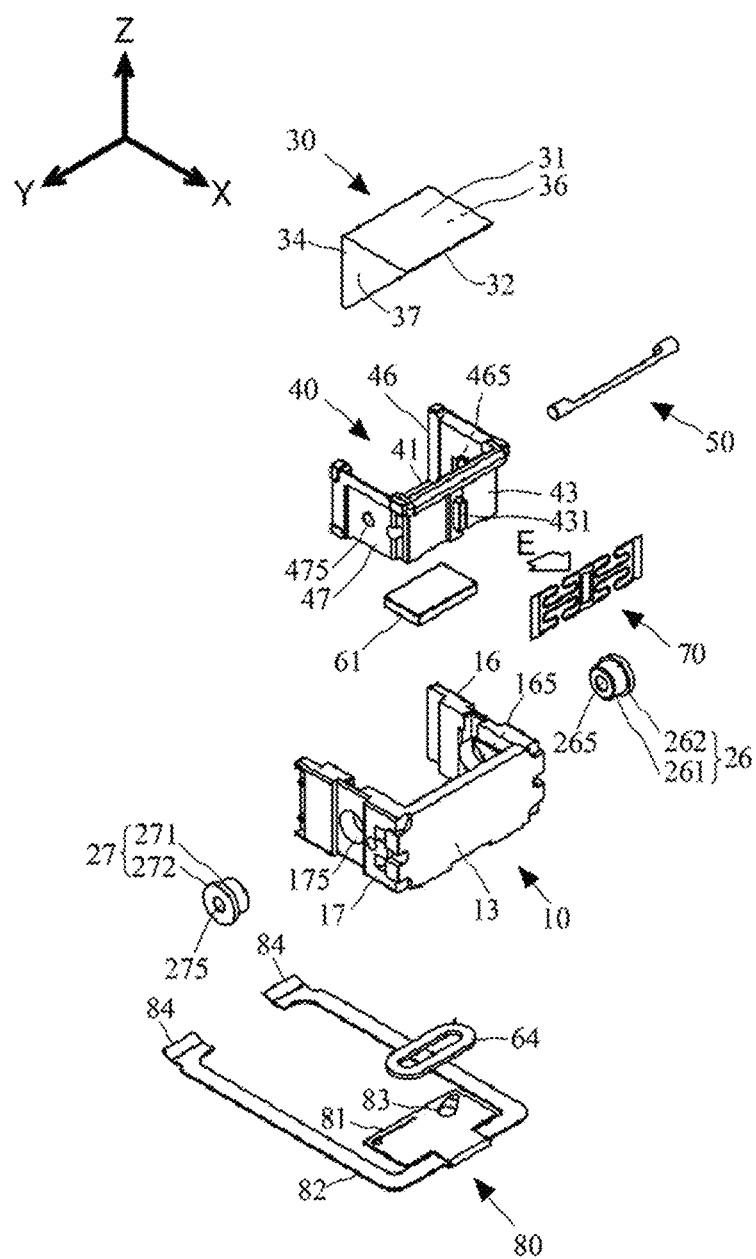
FIG. 7 is a perspective view of the FPC, the coil, the housing, the supporting bearings, the holding member, the supporting shaft, the magnet, the plate spring, and the prism of FIG. 6 as viewed from another viewpoint.

The prism driving device 3 holds the prism 30 and drives the prism 30 around an axis parallel to the Y direction by an electrical signal given by the substrate of the smartphone 400. Thereby, the shaking correction in the Z direction can be performed. As shown in FIG. 6 and FIG. 7, the prism driving device 3 has a FPC (Flexible Printed Circuit board) 80, a coil 64, a housing 10, supporting bearings 26 and 27, a holding member 40, a supporting shaft 50, and a plate spring 70. The FPC 80, the coil 64, the housing 10, the supporting bearings 26 and 27 as well as the case 90 are collectively referred to as a fixed portion.

The FPC 80 is a member that plays a role of relaying current supply from the substrate of the smartphone 400 to the coil 64. As shown in FIG. 6, the FPC 80 has a T-shaped first surface portion 81 and a U-shaped second surface portion 82. As shown in FIG. 3, the first surface portion 81 of the FPC 80 sandwiches a plate 95 on the rear side of the case 90 together with the second surface portion 82 at a part connected to the second surface portion 82, and the first surface portion 81 is folded back to be accommodated in the case 90. That is, the FPC 80 is attached to the case 90 so that the first surface portion 81 and the second surface portion 82 sandwich the plate 95 on the rear side of the case 90 from both sides in the Z direction. The U-shaped second surface portion 82 extends from the rear side position of the prism 30 to a position of the base 941 via a left and right end on the rear side of the plate 95 on the rear side.

The second surface portion 82 connects the first surface portion 81 which the coil 64 is fixed, to the base 941. As shown in FIG. 2, each of terminal 84 provided on the tip of the second surface portion 82 is fixed to each of terminal receiving portions 942 which are provided at a position of a left and right lower end of the base 941. A position of the terminal receiving portions 942 is positioned at the front side slightly in the Z direction than that of the rear end of the base 941. A position of the terminal 84 is positioned at the front side slightly in the Z direction than that of the second surface portion 82.

In one corner of the front surface of the first surface portion 81 of the FPC 80, a concave portion 83 recessed to the rear side is provided. A coil 64 is fixed on the front surface of the first surface portion 81 of the FPC 80. The coil 64 has two linear portions extending in the X direction and two semicircular portions connecting the two linear portions. One of the two semicircular portions of the coil 64 straddles the concave portion 83. The outer portion of the concave portion 83 is located outside the coil 64, and the inner portion thereof is located inside the coil 64. An end portion on the outer side of the coil 64 is connected to the first surface portion 81 of the FPC 80, and an end portion on the inner side of the coil 64 is drawn to the outside of the coil 64 through the concave portion 83 and is connected to the first surface portion 81 of the FPC 80.

The housing 10 is located at a position in the case 90 that covers the first surface portion 81 of the FPC 80 from the front side. The housing 10 includes two side plates 16 and 17 that face each other in the Y direction, and an upper plate 13 and a rear plate 15 that are interposed between the two side plates 16 and 17. In the middle of each of the two side plates 16 and 17, perfect circular through holes 165 and 175 are bored. A concave portion extending in the Z direction is provided at a center rear portion of the upper plate 13, and a convex portion 431 of the holding member 40 to be described later is accommodated in the concave portion. The rear plate 15 is bored with an opening 151 in which the coil 64 is accommodated. The small-diameter portion 261 of the supporting bearing 26 is inserted and fixed in the through hole 165, and the small-diameter portion 271 of the supporting bearing 27 is inserted and fixed in the through hole 175.

The supporting bearings 26 and 27 are members that are interposed between the through holes 165 and 175 and the supporting shaft 50, support the supporting shaft 50 in the supporting holes 265 and 275 thereof in a rocking manner, and assist the rocking of the supporting shaft 50. The supporting bearings 26 and 27 have cylindrical small-diameter portions 261 and 271 with substantially the same diameter as the diameter of the through holes 165 and 175, and cylindrical large-diameter portions 262 and 272 with a slightly larger diameter than the diameter of the through holes 165 and 175. Supporting holes 265 and 275 are bored in the center of the supporting bearings 26 and 27, respectively. The supporting hole 265 penetrates between both end surfaces of the supporting bearing 26, and the supporting hole 275 penetrates between both end surfaces of the supporting bearing 27. The supporting bearings 26 and 27 are fixed to the housing 10 by inserting the small-diameter portions 261 and 271 into the through holes 165 and 175.

The prism 30, the holding member 40, and the supporting shaft 50 are integrated and accommodated in the housing 10, and the holding member 40 is supported by the housing 10 via the plate spring 70. The prism 30 has an incidence surface 31, a reflecting surface 32, an emitting surface 34, and two side surfaces 36 and 37 in the Y direction that are perpendicular to the surfaces 31, 32 and 34. The prism 30 has an optical axis parallel to the Z direction from the incidence surface 31 to the reflecting surface 32 and an optical axis parallel to the X direction from the reflecting surface 32 to the emitting surface 34. The light incident on the incidence surface 31 of the prism 30 from the subject is reflected by the reflecting surface 32 and guided to the lens body 9 through the emitting surface 34.

The holding member 40 is a member that plays a role of holding the prism 30. The holding member 40 has a shape in which a triangular prism-shaped portion occupying substantially half of a rectangular parallelepiped extending in the Y direction is cut out. Specifically, the holding member 40 has a solid portion 41 of right-angled isosceles triangular prism-shape, and two wall portions 46 and 47 extending in a right-angled isosceles triangular prism-shape from the end portions of the solid portion 41 in the Y direction and facing each other in the Y direction. The holding member 40 has a rectangular shape when viewed from the Y direction. Through holes 465 and 475 are provided in the boundary portions between the wall portions 46 and 47 and the solid portion 41, respectively.

As shown in FIG. 6, the end surface 42 facing the front lower direction is a tapered surface inclined by approximately 45 degrees with respect to the XY plane and the YZ plane. The end surface 42 corresponds to the bottom of a right triangle in the solid portion 41 of the holding member 40. On the end surface 42, semicircular supporting portions 48 that slightly protrude from the end surface 42 are provided at positions apart from each other at the boundary portions with the wall portions 46 and 47. The supporting portion 48 is for placing the prism 30. The tips of the four supporting portions 48 form a supporting surface 49, and the supporting surface 49 coincides with the reflecting surface 32 of the prism 30. The centers of the supporting holes 265 and 275 of the supporting bearings 26 and 27 coincide with each other when viewed from the Y direction and are included in the supporting surface 49. The supporting surface 49 and the end surface 42 are substantially parallel, and the end surface 42 does not protrude beyond the supporting surface 49.

There is concave portion 425 concaved in a semicircular shape on the end surface 42 of the solid portion 41. As viewed from the Y direction, the through hole 465 of the wall portion 46 and the through hole 475 of the wall portion 47 overlap with the concave portion 425 of the solid portion 41. The through holes 465 and 475 and the concave portion 425 are provided at substantially the center of the end surface 42. A supporting shaft 50 to be described later is accommodated and fixed in the through hole 465 and 475 and the concave portion 425. Further, the end surface 42 is provided with four recesses 424 each recessed in a stepped shape so that the weight around the supporting shaft 50 is balanced when the prism 30 is attached.

Figure 5A:
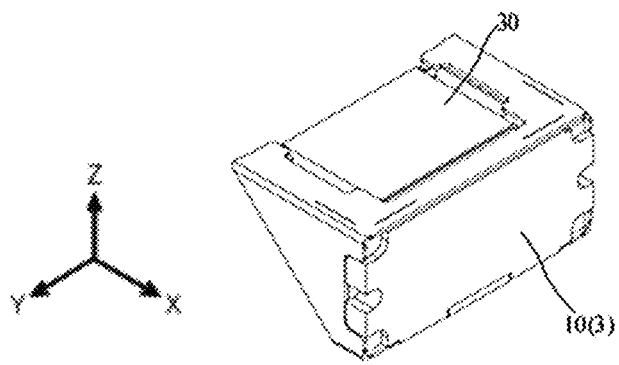
FIG. 5A is a cross-sectional view taken along line B-B' of FIG. 4.

As shown in FIG. 3 and FIG. 5(A), the rear surface 45 of the solid portion 42 is provided with a recess in which a magnet 61 is accommodated and fixed. The magnet 61 is a member that serves as a driving portion for driving the holding member 40 together with the coil 64. The end surface on the rear side of the magnet 61 confronts the coil 64 with a minor space reserved. Further, as shown in FIG. 3 and FIG. 7, the center portion in the Y direction on the upper surface 43 of the solid portion 41 protrudes upward as a convex portion 431. This convex portion 431 is fitted into the opening 731 of the plate spring 70.

Figure 8A:
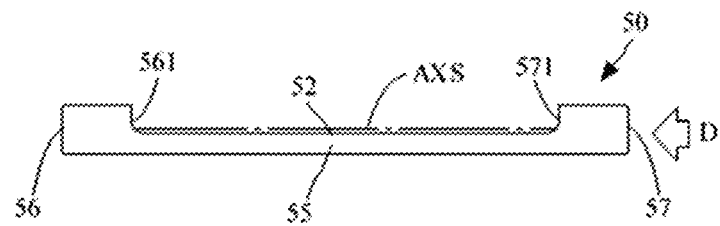
FIG. 8A is a view of the supporting shaft of FIG. 6 as viewed from the direction of arrow C.
Figure 8B:
FIG. 8B is a view of FIG. 8A as viewed from the direction of arrow D.

The supporting shaft 50 is a member that plays a role of supporting the holding member 40 in a rockable manner. As shown in FIG. 8A and FIG. 8B, The shape of the supporting shaft 50 resembles the shape in which an elongated cylindrical is selectively cut out in such a manner that a portion occupying the center thereof in the extending direction is left and the remaining portion forms a semicylindrical shape. The diameter of the supporting shaft 50 is slightly thinner than the diameter of the through holes 465, 475, 265, and 275. The length of the supporting shaft 50 is longer than the distance between the wall portions 46 and 47 facing each other in the Y direction in the holding member 40, and shorter than the distance between the plates 96 and 97 facing each other in the Y direction in the case 90.

Figure 8C:
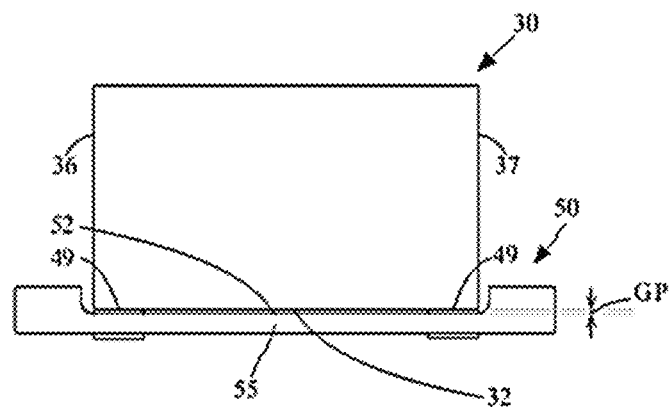
FIG. 8C is a view showing the relationship between the second outer peripheral surface of the supporting shaft of FIG. 8A and the reflecting surface of the prism.

The two end portions of the supporting shaft 50 have a cylindrical shape. The center portion of the supporting shaft 50 has a first outer peripheral surface 55 and a second outer peripheral surface 52 housed within the region of the first outer peripheral surface 55. The first outer peripheral surface 55 is flush with the outer peripheral surface of the cylindrical shape at both ends along the axis line AXS passing through the center O of the cylindrical shape. The center of the first outer peripheral surface 55 is at the same position as the axis line AXS. The second outer peripheral surface 52 is substantially a flat surface. The second outer peripheral surface 52 is located further inside than the cylindrical outer peripheral surface. The second outer peripheral surface 52 is provided at a position cut out from the outer peripheral surface of the cylindrical shape, a portion of which is constituted by the first outer peripheral surface 55, to a depth exceeding the axis line AXS. The boundary portions between the second outer peripheral surface 52 and the erected surfaces 571 and 561 at two ends thereof are curving gently. As shown in FIG. 8C, the prism 30 is arranged so as to be fit within a position cut out to a depth exceeding the axis line AXS.

The supporting shaft 50 is supported so that the center portion fits into the concave portion 425 of the holding member 40, and the second outer peripheral surface 52 thereof faces the normal line direction of the end surface 42 of the holding member 40. The two end portions in the Y direction of the supporting shaft 50 pass through the through holes 465 and 475 of the holding member 40 and are inserted halfway from one end sides of the supporting holes 265 and 275 of the supporting bearings 26 and 27. The centers O of the cylindrical shapes of the two end portions of the supporting shaft 50 and the centers of the through holes 465 and 475 of the holding member 40 coincide with each other.

Figure 5B:
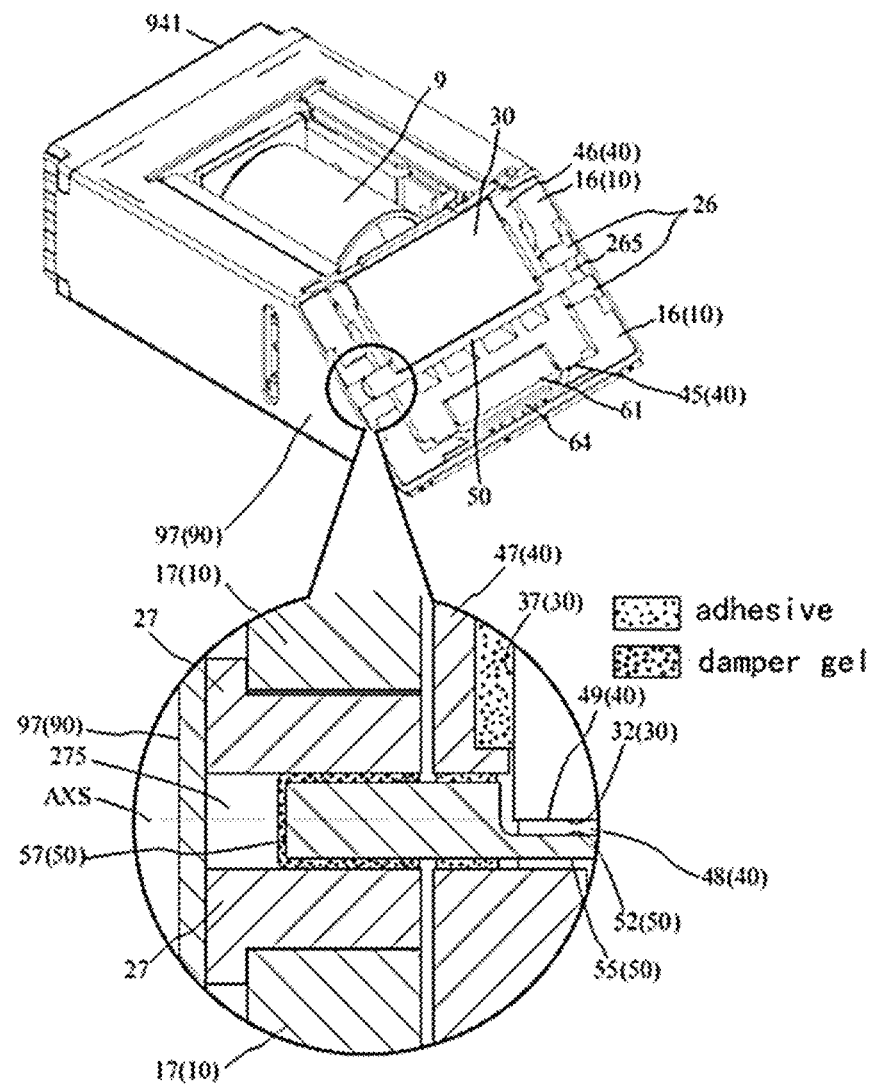
FIG. 5B is an enlarged view inside the frame of FIG. 5A.

As shown in FIG. 5B, the inner surface of the plate 96 and the inner surface of the plate 97 of the case 90 face each other in the Y direction sandwiching the housing 10 and abut against the end surfaces of the large-diameter portions 262 and 272 of the supporting bearings 26 and 27. The inner surface of the plate 96 and the inner surface of the plate 97 close the other end sides of the supporting hole 265 of the supporting bearing 26 and the supporting hole 275 of the supporting bearing 27.

The side surfaces 36 and 37 of the prism 30 on the supporting surface 49 of the holding member 40 and the wall portions 46 and 47 of the holding member 40 are bonded and fixed to each other. Further, a portion of the outer peripheral surface of the supporting shaft 50 composed of the first outer peripheral surface 55 and the outer peripheral surfaces of the cylindrical shapes at two end portions is fixed to at least one of the through holes 465 and 475 or the concave portion 425 of the holding member 40. Adhesive is filled between the outer peripheral surface of the supporting shaft 50 and the inner peripheral surface of the through hole 475 in the through hole 465, and between the outer peripheral surface of the supporting shaft 50 and the inner peripheral surface of the through hole 475 in the through hole 475, so that the holding member 40 and the supporting shaft 50 are fixed. Thereby, the holding member 40, the prism 30, and the supporting shaft 50 are integrated.

When the integration of holding member 40, prism 30, and supporting shaft 50 is viewed from the Y direction, the center O of the first outer peripheral surface 55 of the supporting shaft 50 is on the supporting surface 49 of the holding member 40 and the reflecting surface 32 of the prism 30, wherein the entire second outer peripheral surface 52 is located closer to the side of the first outer peripheral surface 55 than the supporting surface 49 and the reflecting surface 32. That is, since it is assembled so as to be parallel to the end face 42, the second outer peripheral surface 52 is lower than the height of the supporting surface 49 of the holding member 40 and does not contact the reflecting surface 32, as shown in FIG. 8C. Further, even if the second outer peripheral surface 52 is not parallel to the end surface 42, the second outer peripheral surface 52 is set to be lower than the height of the supporting surface 49 of the holding member 40. In this way, as shown in FIG. 8C, a gap GP is formed between the reflecting surface 32 of the prism 30 and the second outer peripheral surface 52 of the supporting shaft 50.

As shown in FIG. 5B, at the portions of the supporting shaft 50 that are fitted in the supporting holes 265 and 275 of the supporting bearings 26 and 27, a resin with viscoelasticity is filled between the outer peripheral surface of the supporting shaft 50 and the inner peripheral surface of the supporting hole 265, and between the outer peripheral surface of the supporting shaft 50 and the inner peripheral surface of the supporting hole 275. The resin with viscoelasticity includes a so-called damper gel. The end surfaces 56 and 57 of the supporting shaft 50 are also provided with a damper gel. By this damper gel, shaking generated in the integration of holding member 40, prism 30, and supporting shaft 50 due to support by the plate spring 70 can be converged at early stage. Further, the damper gel is easy to keep its shape with respect to a normal so-called liquid lubricant, and easily keeps the supporting shaft 50 at the center position of the supporting hole 265 and 275. Further, the spaces between the end surfaces 56 and 57 of the supporting shaft 50 in the supporting holes 265 and 275 and the plates 96 and 97 of the case 90 that is the fixed portion are airtight. Further, the integration of holding member 40, prism 30, and holding member 40 can be rocked with respect to the housing 10.

Figure 9:
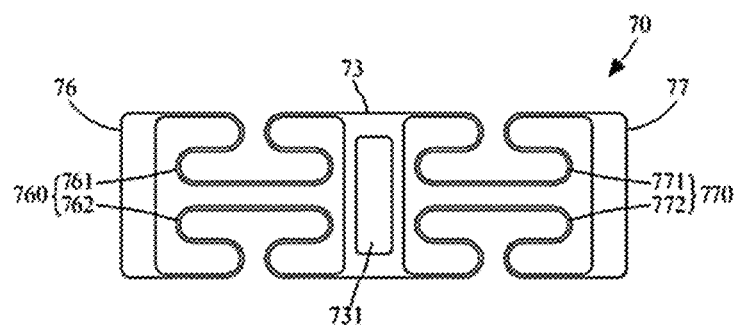
FIG. 9 is a view of the plate spring of FIG. 6 and FIG. 7 as viewed from the direction of arrow E.

The plate spring 70 is a member that plays a role of restricting the movement of the integration of holding member 40, prism 30, and holding member 40 by connecting the housing 10 (the fixed portion) and the holding member 40. The plate spring 70 is arranged so as to extend in the YZ plane, that is, so as to extend in the extending direction of the supporting shaft 50 and the thickness direction of the housing 10 which is the thickness direction of the fixed body. In other words, the plate spring 70 is arranged along the stacking direction of the coil 64 and the magnet 61 so as not to overlap the coil 64 and the magnet 61. As shown in FIG. 9, the plate spring 70 has outer portions 76 and 77 formed at the two ends, a center portion 73 formed at the center, and arm portions 760 and 770 connecting the outer portions 76 and 77 and the center portion 73. Each of the two arm portions 760 and 770 has a twisted shape. The outer portion 76, the center portion 73, and the outer portion 77 are formed so as to be aligned in the Y direction and respectively extend in the Z direction. For convenience, a portion having the outer portion 76, the center portion 73 and the arm portion 760 and a portion having the outer portion 77, the center portion 73 and the arm portion 770 are referred to as plate spring pieces. The plate spring 70 is formed in line symmetry as a whole with the center portion 73 as a symmetry axis. Further, the two plate spring pieces are formed in line symmetry in the Y direction and the Z direction, respectively.

More specifically, the plate spring 70 is a plate body as a whole, and the center portion 73 and the outer portion 76 and 77 are also flat plate bodies. There is a rectangular opening 731 at the center of the center portion 73. The size of the opening 731 is slightly larger than the size of the convex portion 431 of the holding member 40. The arm portion 760 has a first wire 761 connecting the front side end portions of the center portion 73 and the outer portion 76, and a second wire 762 connecting the rear side end portions of the center portion 73 and the outer portion 76. The arm portion 770 has a first wire 771 connecting the front side end portions of the center portion 73 and the outer portion 77, and a second wire 772 connecting the rear side end portions of the center portion 73 and the outer portion 77.

Each of the first wires 761 and 771 and the second wires 762 and 772 has a shape in which an English alphabet "S" and its mirror letter face each other, the end portions facing outward of the two alphabets are stretched in the Y direction to connect the end portions of center portion 73 and the outer portions 76 and 77, and the end portions facing inward are stretched along the Y direction to connected to each other.

The plate spring 70 is fixed to the holding member 40 so that the convex portion 431 of the holding member 40 is fitted into the opening 731. The outer portions 76 and 77 of the plate spring 70 are fixed to the protrusions 432 at the intersecting positions of the side plates 16 and 17 and the housing 10. The plate spring 70 is mounted in a state of keeping a substantially flat plate. The holding member 40 in the housing 10 is held by the plate spring 70 so that the upper surface 43 thereof is in a position confronting the plate 13 of the housing 10 in parallel (hereinafter, this position is referred to as an initial position).

In FIG. 3, when a current flows from the FPC 80 to the coil 64, a driving force in the X direction is generated in the magnet 61 due to the electromagnetic action between the coil 64 and the magnet 61. Since the magnet 61 is disposed to be shifted rearward in the Z direction with respect to the supporting shaft 50, when a driving force on the lower side in the X direction is generated in the magnet 61, the holding member 40 and the prism 30 held in the holding member 40 are rotated in a counterclockwise direction around the supporting shaft 50 as a center. At this time, since the holding member 40 and the housing 10 are connected by the plate spring 70, the integration of prism 30, holding member 40, and supporting shaft 50 is rotated to a position where the driving force generated in the magnet 61 and the urging force accompanying the deformation of the plate spring 70 are balanced. Thereby, the light emitted from the prism 30 is emitted in a direction rotated in a counterclockwise direction with respect to the light emitted at the initial position, and reaches the image sensor 100 via the lens body 9. When the supply of current to the coil 64 is stopped, the integration of prism 30, holding member 40, and supporting shaft 50 is rotated in a clockwise direction by the restoring force of the plate spring 70 and returns to the initial position.

When a current in the reverse direction flows in the coil 64, a driving force on the upper side in the X direction is generated in the magnet 61, and the integration of prism 30, holding member 40, and supporting shaft 50 is rotated in the clockwise direction to a position where the driving force and the urging force are balanced. Thereby, the light emitted from the prism 30 is emitted in a direction rotated in the clockwise direction with respect to the light emitted at the initial position, and reaches the image sensor 100 via the lens body 9. When the supply of current to the coil 64 is stopped, the integration of prism 30, holding member 40, and supporting shaft 50 is rotated in the counterclockwise direction and returns to the initial position.

Figure 10A:
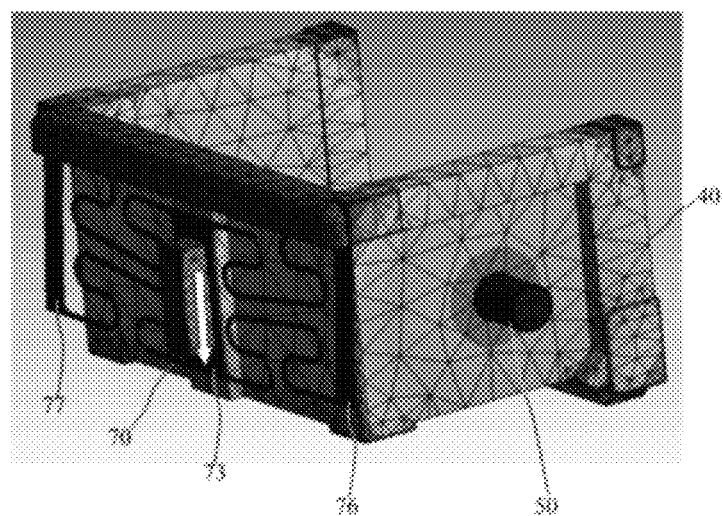
FIG. 10A is a view showing an appearance of the plate spring when the holding member of the prism driving device of FIG. 1 is rocked in the counterclockwise direction.
Figure 10B:
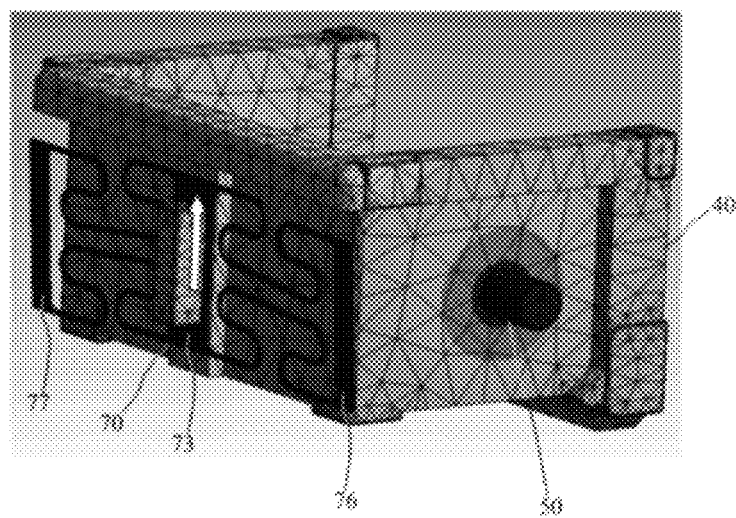
FIG. 10B is a view showing an appearance of the plate spring when the holding member is rocked in the reverse direction.

As shown in FIGS. 10A and 10B, when the integration of prism 30, holding member 40, and supporting shaft 50 is rocked around the supporting shaft 50 as a rocking shaft, the center portion 73 of the plate spring 70 moves relative to the outer portions 76 and 77 in the front-rear direction. At this time, strictly speaking, since the center portion 73 of the plate spring 70 is rocked in an arc shape around the supporting shaft 50, the plate spring 70 is deformed while being twisted between the center portion 73 and the outer portions 76 and 77.

The above is the details of the present embodiment. According to the present embodiment, the following effects can be obtained.

In the present embodiment, the supporting shaft 50 has two end portions of cylindrical shape to be fitted into the supporting holes 265 and 275, and a center portion having a first outer peripheral surface 55 flush with the outer peripheral surface of the cylindrical shape along the axis line AXS of the cylindrical shape and a second outer peripheral surface 52 located further inside than the outer peripheral surface of the cylindrical shape. The center of the first outer peripheral surface 55 is on the supporting surface 49, and the entire second outer peripheral surface 52 is closer to the side of the first outer peripheral surface 55 than the supporting surface 49. Accordingly, the reflecting surface 32 of the prism 30 placed on the supporting surface 49 can be made to coincide with the center of the outer peripheral surface of the supporting shaft 50 that is the rocking shaft. Therefore, according to the present embodiment, it is possible to provide a prism driving device 3 that requires a small space for rocking and is easy to be miniaturized.

Further, in the present embodiment, a supporting shaft 50 and a plate spring 70 are included. The supporting shaft 50 supports the holding member 40 in a rockable manner with respect to the housing 10, and the plate spring 70 connects the housing 10 and the holding member 40. The plate spring 70 is provided to extend in an YZ plane including the Y direction in which the supporting shaft 50 extends. Accordingly, the holding member 40 supporting the prism 30 can easily return to the initial position by the resilient force of the plate spring 70. Therefore, according to the present embodiment, it is possible to provide a prism driving device 3 that can easily return the mounted prism 30 to the initial position.

Further, in the present embodiment, a supporting shaft 50 and supporting bearings 26 and 27 are included. The supporting shaft 50 supports the holding member 40, and the supporting bearings 26 and 27 serve as the fixed portion and are arranged at two end portions of the supporting shaft 50 to support the supporting shaft 50 in a rockable manner with respect to the supporting holes 265 and 275 in the supporting holes 265 and 275 thereof. A resin with viscoelasticity is filled between the outer peripheral surface of the supporting shaft 50 and the inner peripheral surfaces in the supporting holes 265 and 275 of the supporting bearings 26 and 27. Due to this resin, it is difficult for the impact to be transmitted to the supporting shaft 50, and hence, to the prism 30 supported by the supporting shaft 50. Therefore, according to the present embodiment, it is possible to provide a prism driving device 3 in which an impact is difficult to be transmitted to the prism 30 even the impact is applied.

Further, in the present embodiment, a supporting shaft 50 fixed to the holding member 40, and supporting bearings 26 and 27 serving as the fixed portion and supporting the supporting shaft 50 in a rockable manner in the supporting holes 265 and 275 thereof are included. The supporting shaft 50 are fitted up to halfway from one end sides of the supporting holes 265 and 275, and the plates 96 and 97 of the case 90 serving as the fixed portion close the other end sides of the supporting holes 265 and 275. The spaces between the supporting shaft 50 and plates 96 and 97 in the supporting holes 265 and 275 of the supporting bearings 26 and 27 are in an airtight state, and dead air spaces are created in the spaces. The dead air spaces act as air springs. Accordingly, even if the supporting shaft 50 moves in the Y direction, it does not collide with the plates 96 and 97, and even if it collides with them, the impact is small. Therefore, according to the present embodiment, it is possible to provide a prism driving device 3 in which the prism 30 and the holding member 40 and the supporting shaft 50 that support the prism 30 move along the supporting shaft 50 and do not collide with other portions.

Incidentally, in the present embodiment, the supporting shaft 50 may be directly fitted into the through holes 165 and 175 of the housing 10 without providing the supporting bearings 26 and 27. In this case, the through holes 165 and 175 are regarded as the supporting holes 265 and 275. The thicknesses of the two side plates 16 and 17 of the housing 10 and the through holes 165 and 175 in the center thereof in the Y direction are increased. The diameters of the through holes 165 and 175 are slightly larger than the diameter of the supporting shaft 50. Two end portions of the supporting shaft 50 are inserted into the through holes 165 and 175, a resin with viscoelasticity is filled between the inner peripheral surfaces of the through holes 165 and 175 and the outer peripheral surface of the supporting shaft 50, and the outer side surfaces of the side plates 16 and 17 may be abutted against the inner side surfaces of the plates 96 and 97 of the case 90 to close the through holes 165 and 175.

Further, in the present embodiment, the plate spring 70 does not need to be provided along the thickness direction of the housing 10 as long as it is provided to extend along the extending direction of the supporting shaft 50, that is, extend in a plane including the Y direction. For example, it may be provided so as to extend in a direction parallel to the end surface 42. Even in this case, the center portion 73 and the outer portions 76 and 77 of the plate spring 70 are provided so as to always align in the Y direction. Incidentally, in the present embodiment, as for the plate spring 70, the outer portions 76 and 77 are attached to the fixed portion and the center portion 73 is attached to the holding member 40, but the outer portions 76 and 77 may be attached to the holding member 40 and the center portion 73 may be attached to the fixed portion.

Further, in the present embodiment, the members closing the supporting holes 265 and 275 of the supporting bearings 26 and 27 are not necessary to be the plates 96 and 97 of the case 90. For example, members that simply close the supporting holes 265 and 275 may be stuck to the support bearings 26 and 27. Further, the supporting holes 265 and 275 may be provided with a slight air escape port without being completely closed.

What is claimed is:

1. A camera device comprising:
a prism driving device for driving a prism provided at an end of a case;
a lens driving device for driving a lens body provided along the optical axis of the lens body in the case; and
a base for fixing an image sensor, the base provided at the other end of the case opposed to the end,
wherein the prism driving device has a driving portion and a flexible printed circuit board for relaying current supply from an external portion to the driving portion and terminals of the flexible printed circuit board connected to terminal receiving portions of the base,
wherein the driving portion comprises a coil, and the flexible printed circuit board has a first surface portion fixing the coil and an U-shaped second surface portion connecting the first surface portion to the base,
wherein the case has an opening in a front side portion for exposing an incidence surface of the prism thereof, and a plate on a rear side portion opposed to the front side portion and the U-shaped second surface portion connects the first surface portion to the base via the rear side portion of the plate on the rear side portion of the case, the U-shaped second surface portion extending from the rear side position of the prism to a position of the base, and
wherein the first surface portion sandwiches the plate on the rear side portion of the case together with the U-shaped second surface portion at a part connected to the U-shaped second surface portion, and the first surface portion is folded back to be accommodated in the case.

2. The camera device according to claim 1, wherein the U-shape second surface portion passes through a left and right end on the rear side portion of the plate.

3. The camera device according to claim 1, wherein the coil is fixed on a front surface of the first surface portion of the flexible printed circuit board, the front surface facing the prism.

4. The camera device according to claim 3, wherein a concave portion recessed to the rear side is provided in the front surface of the first surface portion and an outer portion of the concave portion is located outside the coil, and the inner portion thereof is located inside the coil.

5. The camera device according to claim 1, further comprising: the prism, the lens body, and the image sensor.

6. An electronic apparatus comprising a camera device according to claim 5.

7. A camera device comprising:
a prism driving device for driving a prism provided at an end of a case,
a lens driving device for driving a lens body provided along the optical axis of the lens body in the case, and
a base for fixing an image sensor, the base provided at the other end of the case opposed to the end,
wherein the prism driving device has a driving portion and a flexible printed circuit board for relaying current supply from an external portion to the driving portion and terminals of the flexible printed circuit board connected to terminal receiving portions of the base,
wherein the driving portion comprises a coil, and the flexible printed circuit board has a first surface portion fixing the coil and an U-shaped second surface portion connecting the first surface portion to the base, and
wherein terminals provided at the tips of the base side of the U-shaped second surface portion are positioned at terminal receiving portions provided at a position of a left and right lower end of the base provided at the lower side portion of the case.

8. The camera device according to claim 7, wherein a position of the terminal receiving portions of the base is located at a front side opposed to the rear side portion of the case than that of rear end of the base.

9. The camera device according to claim 7, wherein a position of the terminals is located at a front side opposed to the rear side portion of the case than that of the U-shaped second surface portion.

10. The camera device according to claim 7, wherein the coil is fixed on the a front surface of the first surface portion of the flexible printed circuit board, the front surface facing the prism.

11. The camera device according to claim 10, wherein a concave portion recessed to the rear side is provided in the front surface of the first surface portion and an outer portion of the concave portion is located outside the coil, and the inner portion thereof is located inside the coil.

12. The camera device according to claim 7, wherein further comprising, the prism, lens body, and image sensor.

13. An electronic apparatus comprising the camera device according to claim 7.

* * * * *